United States Patent [19]

Matsui et al.

[11] Patent Number: 4,697,303
[45] Date of Patent: Oct. 6, 1987

[54] WITHDRAWAL APPARATUS FOR A CARD-LIKE STRUCTURE

[75] Inventors: Kazuhiro Matsui, Toyoake; Mitsuru Tanigawa, Yokkaichi; Haruyuki Sugiura, Kariya, all of Japan

[73] Assignee: Kitagawa Industries Co., Ltd., Nagoya, Japan

[21] Appl. No.: 857,317

[22] Filed: Apr. 30, 1986

[30] Foreign Application Priority Data

Jul. 2, 1985 [JP] Japan .................. 60-145632

[51] Int. Cl.[4] ............ B25G 3/04; B25G 3/18
[52] U.S. Cl. ................... 16/112; 16/114 R; 16/225; 16/DIG. 24; 403/316; 439/160
[58] Field of Search ............ 16/110 R, 112, 114 R, 16/115, 223, 225, DIG. 24, DIG. 40; 74/523, 543; 403/316; 339/45 M

[56] References Cited

U.S. PATENT DOCUMENTS

| 3,643,988 | 2/1972 | Ingvartsen | 403/316 X |
| 4,261,076 | 4/1981 | Clemens | 16/115 X |
| 4,466,754 | 8/1984 | Poitier | 403/316 X |
| 4,514,876 | 5/1985 | Houlberg | 16/110 R |
| 4,530,615 | 7/1985 | Katsuura et al. | 16/112 X |

Primary Examiner—Fred Silverberg
Attorney, Agent, or Firm—Oblon, Fisher, Spivak, McClelland, & Maier

[57] ABSTRACT

A withdrawal apparatus for card like structures includes a body having two rigidly connected parallel sides defining a channel therebetween. A movable member is pivotally connected to the body via a flexible hinge and supports a pin at the end thereof opposite the hinge. Pivoting of the movable member about the hinge causes the pin to enter an aperture in the sides of the body and extending through the channel and any card like structure within the channel. A retaining member on the movable member cooperates with a retaining portion of the body to retain the pin within the aperture.

5 Claims, 14 Drawing Figures

WITHDRAWAL APPARATUS FOR A CARD-LIKE STRUCTURE

BACKGROUND OF THE INVENTION

1. Technological Field

The present invention relates to a withdrawal apparatus for handling card-like-structure which makes the pulling-out of each substrate easy when it is taken out from a substrate rack storing a plurality of circuit substrates (hereinafter described as substrates) such as a printed circuit board, etc. for electronic machinery.

2. Prior Art

A plurality of card-like structures such as a printed circuit board, etc., has been employed for the electronic apparatuses, e.g., computers, telephone switching equipment. As such plurality of substrates are normally arranged parallel in substrate racks in a predetermined narrow interval so that each substrate may be taken out in case of maintenance or repair.

However, connector pads for connecting each substrate electrically are set on a rear end of the substrate stored in the substrate rack. Such connector pads are inserted and mated with connectors on the rack side fixed onto the back side thereof. So, it is not easy to pull out substrates from the rack, or sometimes the substrates are damaged by compulsory withdrawal in case of repair, etc. as it is impossible to insert fingers between the substrates spaced closely and the connector pads on the rear end must be pulled out for removing the substrates.

Conventionally, the apparatuses for handling card-like structures set on front end corner portions of each substrate and used for withdrawing substrates, such as U.S. Pat. No. 4,261,076, have been offered.

As shown in FIGS. 13A and 13B, the conventional apparatus is constituted so as to form first and second halves 50 and 51 in a body via a hinge member 52 of synthetic resin, equip the first half 50 with an aperture 53, protrudingly provide a pivot pin 54 to a corresponding position of the second half 51, further, set concave portions 50a and 51a inside the first and second halves 50 and 51 for inserting the substrate. The apparatus for handling card-like structure is rotatably fitted in relation to the pivot pin 54 so as to bend the first and the second halves 50 and 51 inward via the thin hinge member 52, to not only insert the pivot pin 54 into a hole on the substrate but fit it into the aperture 53 on the other side and hold the substrate between the first and second halves 50 and 51. As described above, when the substrate is removed from the rack, the apparatus for handling card-like structure set on both corner portions of the front end acts like the lever wherein the rear end is a fulcrum, the pivot pin is a point of action and the distant end is a point of application by pulling the distant end straight with its rear end attached to the side of the rack.

But in conventional apparatuses described above, the first and the second halves 50 and 51 are closed only via the pivot pin 54. Accordingly, if a large extracting force is applied to the pin 54 during withdrawal of the substrate, there will be such a problem as the pivot pin 54 being bent, the first and the second halves 50 and 51 being easily opened because of the thin hinge member 52 and the pin 54 coming off the aperture 53 so the apparatus may be separated from the substrate.

SUMMARY OF THE INVENTION

In consideration of the problems mentioned above, disclosed is an apparatus for handling card-like structure mounted onto a front end corner portion of a substrate set on a substrate rack. When pivoted, it is possible to withdraw the substrate from the rack without coming-off.

The apparatus of the present invention for handling card-like structure is constituted to comprise a body including a channel 2 connected along an edge of a card-like structure 40, a pivot pin 7 extending from one end of said body 1 and connecting to a side surface thereof near the other end via a flexible hinge means 6, retaining means 9, and a movable member 5 swinging said pin 7 into said body 1 so that said pin 7 may be received in said body 1 when said retaining means 9 mating with said body 1.

DETAILED DESCRIPTION OF THE PREFERRED EMBODIMENT

The embodiment of the present invention will be described as follows with reference to the figures.

Figure 1:
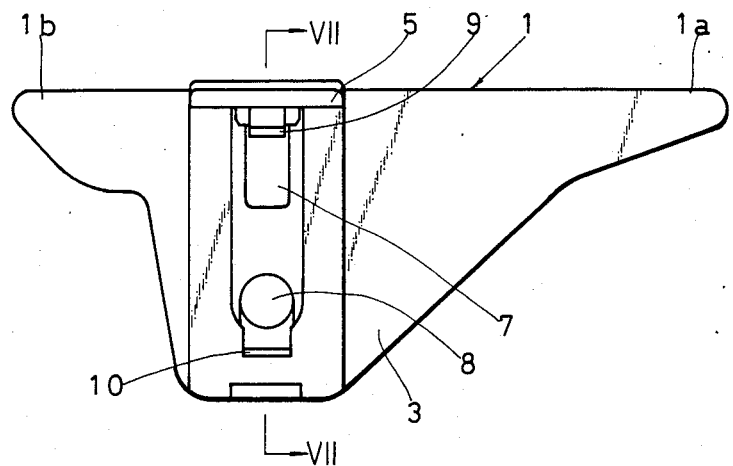
FIG. 1 is a front view of the first embodiment of the apparatus for handling card-like structure.
Figure 2:
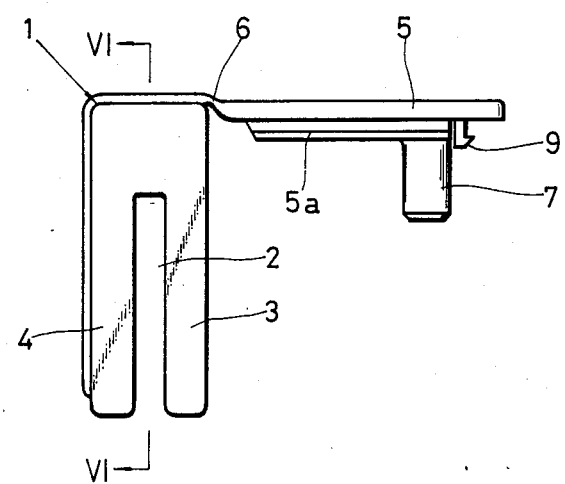
FIG. 2 is a left side view thereof.
Figure 3:
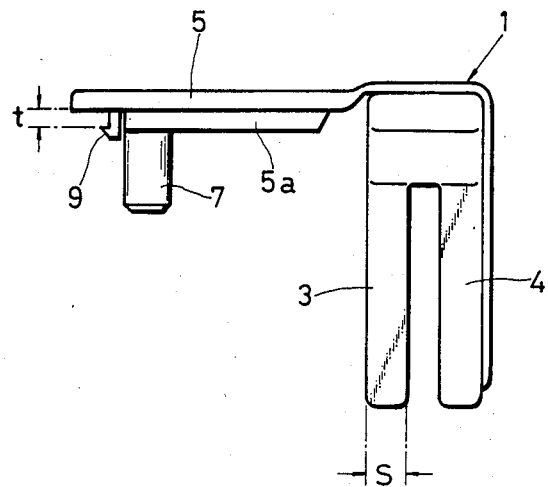
FIG. 3 is a right side view thereof.
Figure 4:
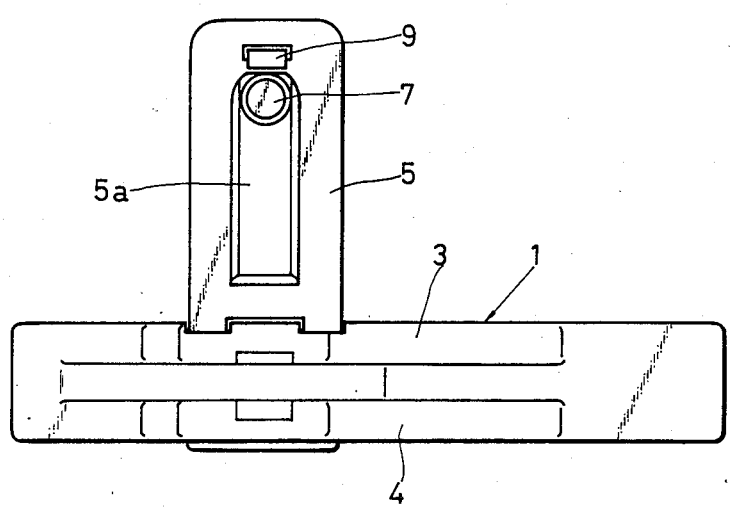
FIG. 4 is a base view thereof.
Figure 5:
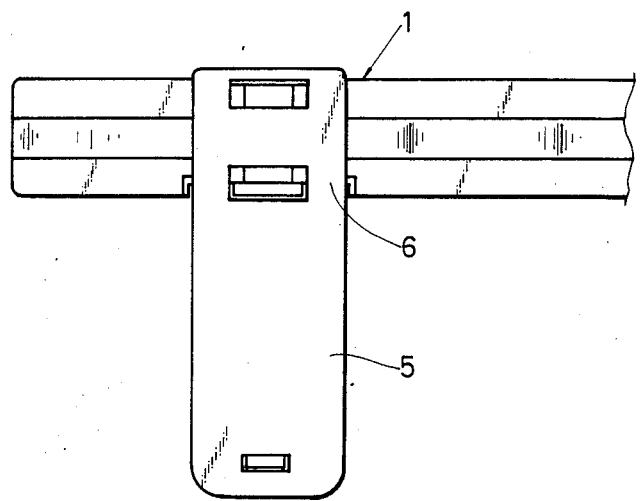
FIG. 5 is a plane view thereof.
Figure 6:
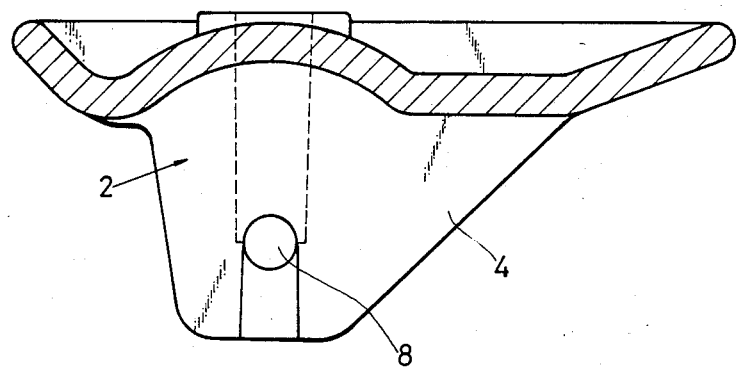
FIG. 6 is a sectional view of FIG. 2 taken on line VI—VI.
Figure 7:
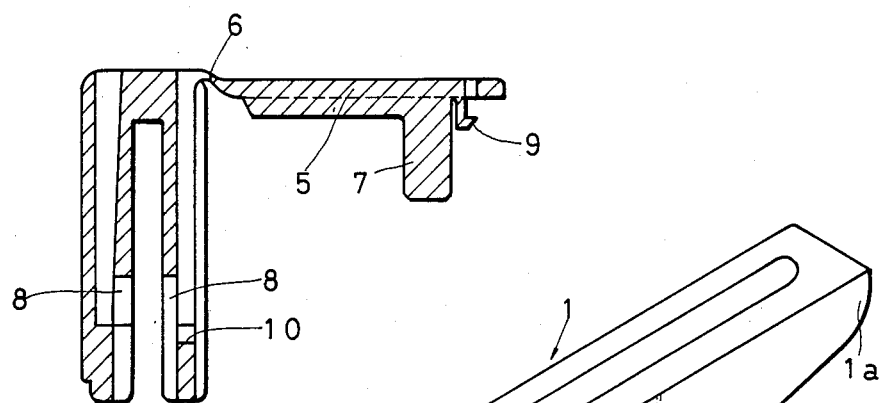
FIG. 7 is a sectional view of FIG. 1 taken on line VII—VII.
Figure 8:
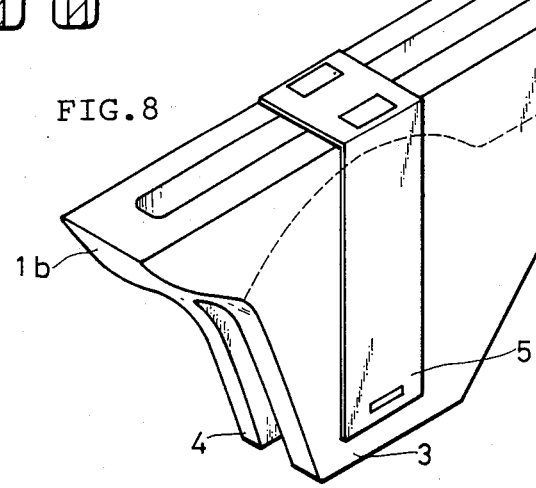
FIG. 8 is a perspective view in the close condition.

FIGS. 1 through 10 show the apparatus for handling card-like structure of the first embodiment. The body 1 is in a thick plate of roughly a triangular form having a channel 2 for inserting a front end corner portion of a substrate extending from the lower side to the middle portion in FIG. 1. The body 1 is constituted so that both sides 3 and 4 may hold the substrate between themselves, wherein a front end portion 1a is formed a little longer than a rear end portion 1b to facilitate withdrawal by fingers. The channel 2 is formed of such dimensions as possible for the substrate to be inserted without looseness, wherein an upper portion thereof protruding in a circular arc so that the front end corner of the substrate may not touch during rotation as shown in FIG. 6. In the middle of the side 3 of the body 1, a concave portion is formed wherein a movable member 5 is formed onto the body 1 adapted to open and close over the concave portion via a hinge member 6 on an upper end. At the center inside the movable member 5 is longitudinal direction, is formed a thick portion 5a wherein a pivot pin member 7 is protudingly provided inside as to be inserted into an aperture 8 of the substrate. The aperture 8 which mates with the pin 7 is provided inside the body 1 when the movable member 5 is folded with the side 3 of the body 1. The pin 7 mates with the aperture 8 through the body 1 and the channel 2 when the movable member 5 is folded. Especially, in the embodiment, the thickness t of the thick portion 5a is less than that of the side 3 as illustrated in FIG. 3. In addition, a retaining member 9 is protrudingly formed with an end inside the movable member 5 so as to be forced into a retaining portion 10 at the lower side of the aperture 8 provided with the side 3 of the body 1 when the movable portion 5 is folded. Thus the pin 7 would not easily come off with the member 5 closed. The apparatus for handling card-like structure described above is formed in a single body from synthetic resin like nylon, etc. At the upper portion of the body 1, a channel is formed in longitudinal direction for reducing weight.

The apparatus mentioned above is fit onto a substrate 40 so that the channel 2 thereof may mate with the front end corner portion of the substrate 40. Then the movable member 5 thereof is folded toward the body 1 with an aperture formed on the substrate 40 beforehand and the aperture 8 of the body 1 aligned. Thus as in FIG. 9, the apparatus is fit onto the front end corner portion of the substrate 40. At this time, the pin 7 is inserted into the hole of the substrate and the aperture 8 of the body, while the retaining member 9 is forced into the retaining portion 10 of the body. Therefore, the body 1 thereof is pivotably fitted onto the substrate via the pin 7 and the folding condition of the movable member 5 is secured by the retaining member 9.

In this condition, supported by guardrails, etc. not specified in the figures, the substrate 40 is inserted into a substrate rack 41 and a connector pad 42 fixed onto a rear end of the substrate 40 is put into a connector of the rack not specified.

Figure 10:
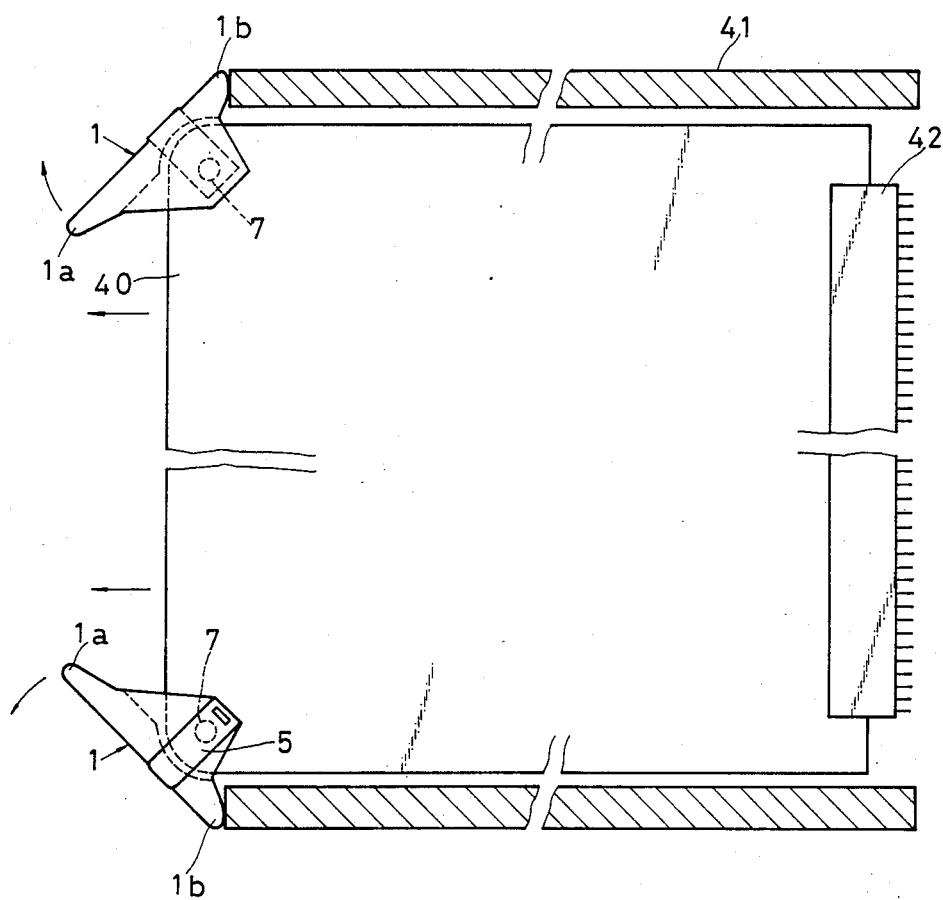

With a plurality of the substrates 40 closely placed in the rack 41, if any of them are with drawn for repair, etc, the front end portion 1a should be pulled in the arrow direction as in FIG. 10 to rotate the body 1 outward about the pin 7. Thus, when further outward rotation of the front end portion 1a is carried out the rear end 1b contacts part of the substrate rack 41 and the pin 7 is moved in the same direction with the contact point acting as a fulcrum so that the substrate 40 retained by the pin 7 may be easily moved forward, and concurrently, the connector may be withdrawn. Such an operation on both front ends makes it easy for the substrates to be taken out without damage even if they are placed closer together or require high strength with the connector. The substrates with the connector removed, taken out by the apparatus so as to be caught by fingers, are easily pulled out manually and withdrawn from the rack 41.

In the embodiment thereof, wherein no thin portions such as a hinge member 52 of conventional inventions are provided, the apparatus does not open in use. Additionally, as the thickness t of the thick portion 5a is less than that of the side 3, the portion 5a never touches the substrate 40, thus, no extra force is applied and the movable member thereof would not open if the hinge member 6 is thin.

Figure 11:
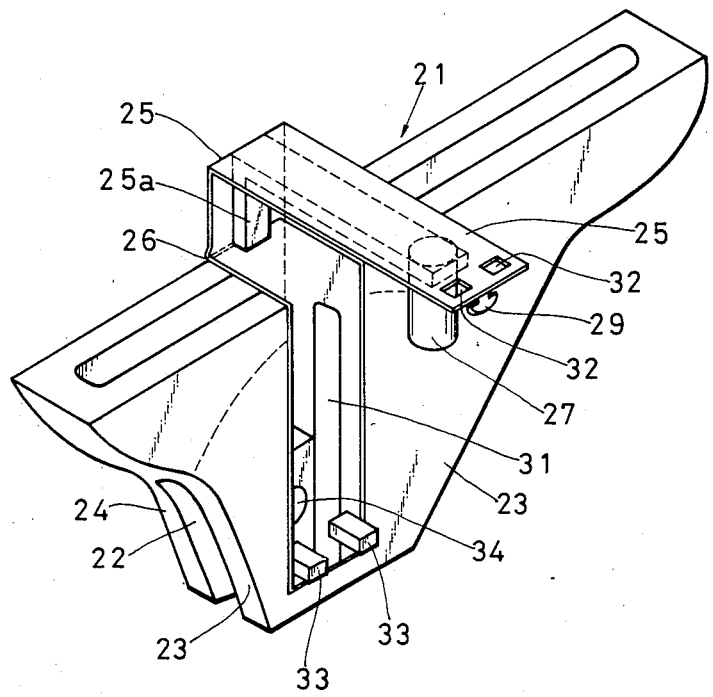
FIG. 11 is a perspective view of the second embodiment.

The second embodiment of the present invention is shown in FIG. 11, wherein a body 21 is a thick plate of roughly triangular form having a channel 22 which extends from the lower side to the middle portion and constituted so that both sides 23, 24 thereof may hold a substrate between themselves. In the middle of the body 21, a notched portion 31 connecting to the channel 22 is formed from the side 23 to the upper portion thereof. A L-shaped movable member 25 is pivoted to the upper portion of the body 21 via a hinge member 26. A pivot pin 27 protrudingly provided as well as a thick portion 25a is vertically formed inside the movable member 25. At the end thereof, two of rectangular apertures 32 are carried, additionally, a retaining member 29 are protrudingly provided inside thereof. Two protrusions 33 which mate with the apertures 32 on the movable member 25 is formed with narrower distance than the maximum width of the retaining member 29 at the lower portion of the notched portion 31 on the body 21. Further, an aperture for the pivot pin 34 is provided at the lower back of the notched portion 31 or on the side 24 opposite thereof.

In the apparatus constituted as above, the movable member 25 is rotated to be lower than the hinge member 26, to close the notched portion 31 on the body 21 with the front end corners of the substrate forced into the channel 22 of the body 21 and the hole of the substrate aligned with the aperture 34. Then, the pivot pin 27 is fit into the aperture 34 at the back of the notched portion through the hole of the substrate. Also, the protrusions 33 are fit with the rectangular apertures 32 on the lower end of the movable member 25, additionally, the retaining member 29 is retained at the back of the two protrusions 33 after going through them.

Figure 9:
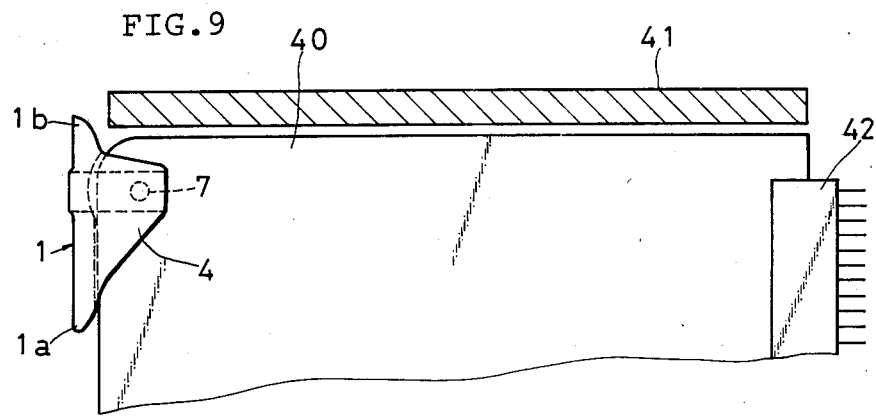
FIGS. 9 and 10 are plane views in use.

The substrate illustrated in FIG. 11 is used as same as in FIGS. 9 and 10. Withdrawal is carried out by contacting the rear end thereof with the part of a rack with the opposite end held on and being rotated about the pivot pin 27 with the opposite end acted as a fulcrum. As with the apparatuses mentioned above, the movable member 25 will never open by the pivot pin 27 and the retaining member 29 and the substrate will be caught in the channel 22 without fail, even if much strength is applied to the pin 27. In addition, coming-off of the pin 27 can be prevented as the load is supported by fitting of two protrusions 33 with the apertures 32 and no deformation of the movable member 25 and bending of the pin 27 occur in case of rotation.

Figure 12:
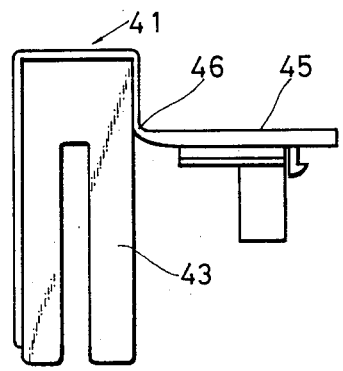
FIG. 12 is a left side view of other embodiments.
Figure 13A:
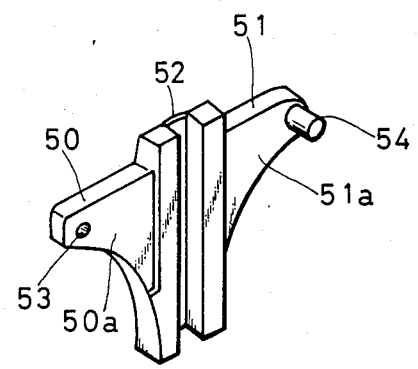
FIGS. 13A and 13B are perspective views of conventional apparatuses.
Figure 13B:
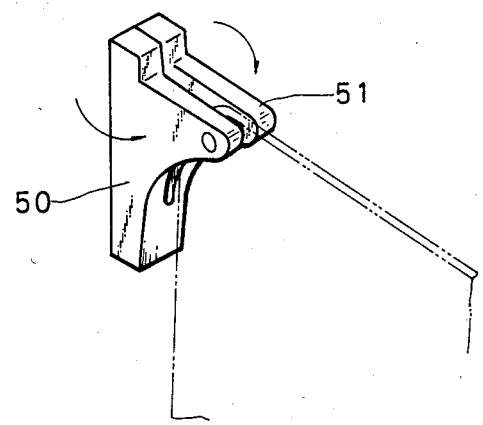

Also, as in the third embodiment illustrated in FIG. 12, it is possible to provide a movable member 45 in the middle of a side 43 of a body 41 via a hinge member 46.

What is claimed is:

1. A withdrawal apparatus for card like structures, comprising:
    a body having two rigidly connected parallel sides defining a channel therebetween;
    a movable member pivotally connected to said body via a flexible hinge;
    an aperture in at least one of said sides;
    a pin mounted on said movable member at a position such that said pin fits into said aperture and extends through said channel upon pivoting of said movable member; and
    means formed on said body and said movable member for retaining said pin fitted into said aperture.

2. The apparatus of claim 1 wherein said body includes extending end portions protruding along a direction of said channel.

3. The apparatus of claim 2 in combination with a card like structure fitted in said channel with said pin extending through a hole in said card like structure.

4. The apparatus of claim 3 including a housing into which said card like structure is fit, wherein said body is positioned relative to said card like structure such that relative rotation therebetween about an axis of said pin causes engagement of said housing with one of said ends of said body.

5. The apparatus of claim 2 wherein said retaining means comprise a hook like retaining member on said movable member and a retaining portion on said body with which said retaining member can engage.

* * * * *